(12) United States Patent
Deeley

(10) Patent No.: US 7,679,400 B2
(45) Date of Patent: Mar. 16, 2010

(54) SYSTEM AND METHOD FOR LOCAL GENERATION OF PROGRAMMING DATA IN A PROGRAMMABLE DEVICE

(75) Inventor: Simon Deeley, Bristol (GB)

(73) Assignee: Panasonic Corporation, Osaka (JP)

( * ) Notice: Subject to any disclaimer, the term of this patent is extended or adjusted under 35 U.S.C. 154(b) by 0 days.

(21) Appl. No.: 12/123,670

(22) Filed: May 20, 2008

(65) Prior Publication Data

US 2008/0290895 A1    Nov. 27, 2008

(30) Foreign Application Priority Data

May 22, 2007    (EP)    ................... 07108690

(51) Int. Cl.
*H03K 19/173*    (2006.01)
(52) U.S. Cl. .......................... 326/38; 326/47
(58) Field of Classification Search ............. 326/37–41, 326/47, 101, 10
See application file for complete search history.

(56) References Cited

U.S. PATENT DOCUMENTS

| | | | |
|---|---|---|---|
| 4,899,067 A | 2/1990 | So et al. | |
| 6,530,071 B1 | 3/2003 | Guccione et al. | |
| 6,874,108 B1 | 3/2005 | Abramovici et al. | |
| 7,145,344 B2 * | 12/2006 | Mark et al. | 324/525 |
| 7,180,324 B2 * | 2/2007 | Chan et al. | 326/10 |
| 7,251,804 B1 * | 7/2007 | Trimberger | 716/16 |
| 2001/0024467 A1 | 9/2001 | Eto | |
| 2006/0268989 A1 | 11/2006 | Kadono et al. | |
| 2007/0028197 A1 | 2/2007 | Santoso et al. | |
| 2008/0031445 A1 | 2/2008 | Lee et al. | |

FOREIGN PATENT DOCUMENTS

| | | |
|---|---|---|
| EP | 0351983 | 1/1990 |
| WO | 02/27928 | 4/2002 |

* cited by examiner

*Primary Examiner*—James Cho
(74) *Attorney, Agent, or Firm*—Greenblum & Bernstein PLC

(57) ABSTRACT

An apparatus for and method of programming a programmable logic device, the programmable logic device comprising a plurality of serially connected programmable logic regions. The method comprises the steps of receiving initial programming data for programming the plurality of serially connected programmable logic regions and receiving transformation data related to the presence and location of at least one faulty serially connected programmable logic region. The method also comprises the steps of generating bypass programming data which, in use, renders a serially connected programmable logic region logically invisible and generating effective programming data by incorporating, using information found in the transformation data, the bypass programming data into the initial programming data. Finally, the method comprises the step of programming the programmable logic device using the effective programming data such that the at least one faulty serially connected programmable logic region is programmed with the bypass programming data.

6 Claims, 5 Drawing Sheets

SYSTEM AND METHOD FOR LOCAL GENERATION OF PROGRAMMING DATA IN A PROGRAMMABLE DEVICE

The present invention relates to a system and method for the local generation of programming data in a programmable logic device.

During the manufacturing of semiconductor devices, process errors may render parts of a circuit unusable. In order to address this problem, initial manufacturing techniques involved testing the finished circuits and discarding defective ones. Then, to improve on this wasteful practice, various methods of fault-tolerance were introduced into manufacturing processes.

Typically, methods of providing fault-tolerance in programmable logic devices comprise the steps of determining the required functional circuit size and adding an extra section, the redundant part being used to replace any defective parts after manufacture. Although fault-tolerance adds to the size and cost of each device, the number of devices which can be used (the yield) is increased to an extent which sees an overall reduction in the average cost of each usable device.

Some fault-tolerant systems have a programming interface for each repeated region of the programmable device. Information about the location of the fault is used to redirect programming data from a faulty region to another. However, these solutions require extra dedicated circuitry to redirect the programming data. This additional routing circuitry further increases the size and cost of the programmable device, driving up the cost of each usable device.

In order to overcome this problem, fault-tolerant methods were developed which involve creating programming data tailored to work around various faults. Using Computer Aided Design (CAD) software, an original program is altered in order to create a series of different programs, each one of which is design to avoid at least one area of the programmable logic device. Once a device is manufactured, it is tested to determine the presence and location of any fault. Based on the results of these tests, one of the altered programs is then chosen to program the device. Accordingly, it is possible to avoid the use of almost any faulty area of the device. However, this method not only requires the pre-programming of several altered programs, it also necessitates a complex manufacturing infrastructure in order to support the making of this kind of choice during the manufacturing process.

Thus, there exists a clear need to provide a method of providing fault-tolerance in a programmable logic device that does not require the addition of dedicated routing circuitry. Moreover, there is also a need for a method of providing fault-tolerance in a programmable logic device which does not require the creation of several versions of programming data and which does not require the utilisation of a complex manufacturing infrastructure.

In order to solve the problems associated with the prior art, the present invention provides a method of programming a programmable logic device, the programmable logic device comprising a plurality of serially connected programmable logic regions, the method comprises the steps of:

receiving initial programming data for programming the plurality of serially connected programmable logic regions;

receiving transformation data related to the presence and location of at least one faulty serially connected programmable logic region;

generating bypass programming data which, in use, renders a serially connected programmable logic region logically invisible;

generating effective programming data by incorporating, using information found in the transformation data, the bypass programming data into the initial programming data;

programming the programmable logic device using the effective programming data such that the at least one faulty serially connected programmable logic region is programmed with the bypass programming data.

Preferably, the step of generating the effective programming data further comprises the steps of:

determining, using the transformation data, a specific point where the bypass programming data should be incorporated into the initial programming data, the specific point being related to the physical location of the faulty serially connected programmable logic region; and inserting the bypass programming data into the initial programming data at the specific point.

The step of inserting the bypass programming data into the initial programming data may further comprise the steps of:

halting the reception of the initial programming data until the bypass data has been inserted into the initial programming data; and resuming the reception of the initial programming data.

The step of inserting the bypass programming data into the initial programming data may further comprise the steps of:

storing incoming initial programming data into memory means until the bypass data has been inserted into the initial programming data; and reading the initial programming data which was stored in the memory means.

The present invention further provide an apparatus for programming a programmable logic device, the programmable logic device comprising a plurality of serially connected programmable logic regions, the apparatus comprises:

initial programming data receiving means arranged to receive initial programming data for programming the plurality of serially connected programmable logic regions;

transformation data receiving means arranged to receive transformation data related to the presence and location of at least one faulty serially connected programmable logic region;

bypass programming data generating means arranged to generate bypass programming data which, in use, renders a serially connected programmable logic region logically invisible;

effective programming data generating means arranged to generate effective programming data by incorporating, using information found in the transformation data, the bypass programming data into the initial programming data;

programming the programmable logic device using the effective programming data such that the at least one faulty serially connected programmable logic region is programmed with the bypass programming data.

Preferably, the effective programming data generating means further comprises:

determining means arranged to determine, using the transformation data, a specific point where the bypass programming data should be incorporated into the initial programming data, the specific point being related to the physical location of the faulty serially connected programmable logic region; and inserting means arranged to insert the bypass programming data into the initial programming data at the specific point.

The inserting means may further comprise:

halting means arranged to halt the reception of the initial programming data until the bypass data has been inserted into the initial programming data; and resuming means arranges to resume the reception of the initial programming data.

The inserting means may further comprise:

storing means arranged to store the incoming initial programming data into memory means until the bypass data has been inserted into the initial programming data; and reading means arranged to read the initial programming data which was stored in memory means.

As will be appreciated, the present invention provides several advantages. For example, the present invention diminishes the programming and hardware overhead associated with fault-tolerance, thereby diminishing manufacturing cost and complexity. Also, the present invention provides a system and method of programming a programmable logic device which hides the existence of fault-tolerance from the CAD software generating the initial programming data. Moreover, the fault-tolerance provided by the method and system of the present invention is also hidden from the user, thus improving ease of use.

An example of the present invention will now be described with reference to the accompanying drawings, in which.

A typical programmable logic device is programmed with a bitmap of data stored in memory distributed throughout the device. For each programmable element of the device, there is associated data stored in specific memory elements. The program memory in most programmable devices is populated with data in such a way as to enable the entire programmable device acts as one large memory (i.e. each element has an address that uniquely identifies it amongst all elements).

When a device is to be programmed, an address and some data are presented to the device's programming interface. The programming interface then sends the data to the addressed element while all other elements remain inactive.

Figure 1:
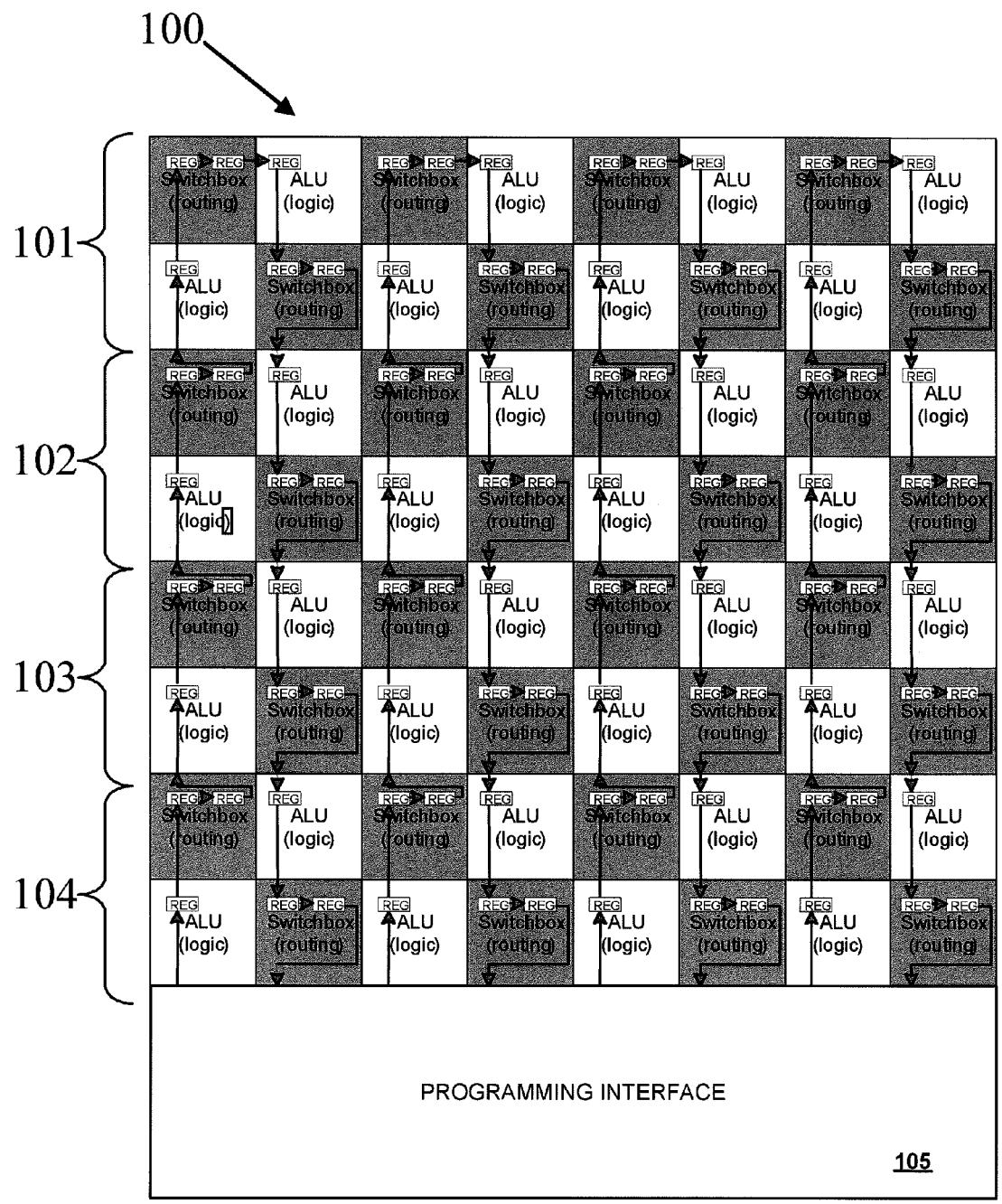
FIG. 1 is a diagram representing the programmable logic architecture of a device for use with the method of the present invention.

Some emerging programmable logic architectures comprise repeating strips of identical blocks. FIG. 1 shows an example of such an architecture. The programmable logic device 100 of FIG. 1 comprises a series of strips 101, 102, 103 and 104. Each strip 101, 102, 103 and 104 can be linked together. Accordingly, strips can be stacked in order to build larger coherent arrays.

Each strip has a series of available routing resources which serve to connect the strips to each other. The available routing resources of a strip surrounded by two other strips can be programmed to a bypass mode by passing the connections input from a first adjacent strip to those output to a second adjacent strip, thereby rendering the middle strip logically invisible.

Figure 2:
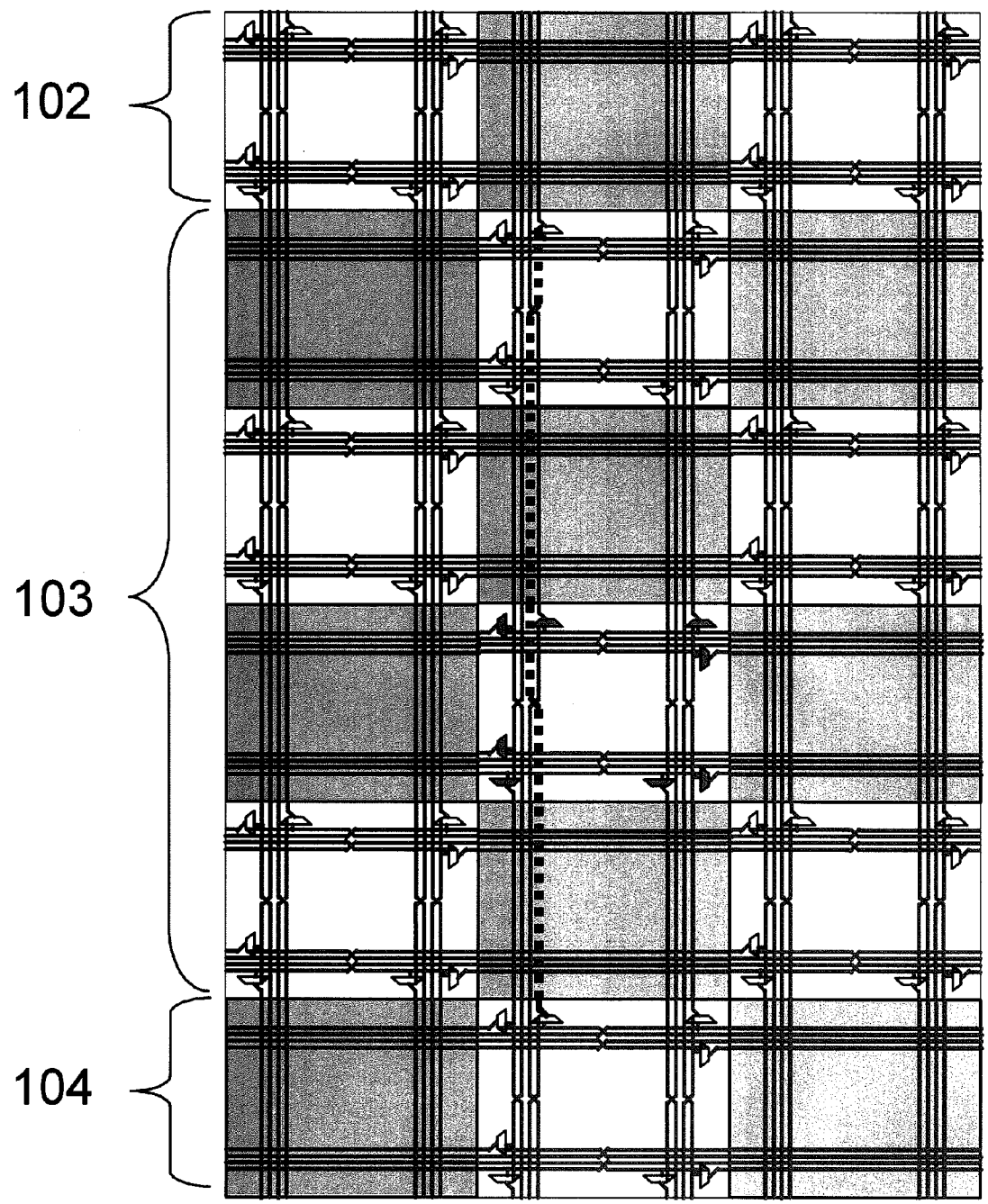
FIG. 2 is a diagram representing a more detailed view of the logic architecture of the device of FIG. 1.

FIG. 2 shows a more detailed view of the routing resource of FIG. 1. The routing is shown as implemented using multiplexers. However, other implementations such as pass-gates or transmission-gates are possible. As shown in FIG. 2, the routing network is repeated such that there are direct paths between the inputs and outputs of each strip. For example, the dotted line in FIG. 2 shows how one input of strip 103 can be directly connected to the output of strip 103. Thus, the output of strip 102 can effectively be directly connected to the input of strip 104.

Accordingly, for programmable logic devices having an architecture based on repeated strips of logic blocks, it is possible to implement fault-tolerance by adding an extra strip to the device. Then, if a fault is detected in a strip, the faulty strip can be programmed with a configuration that configures its inputs to be directly connected to its outputs, thereby rendering it logically invisible.

Figure 3:
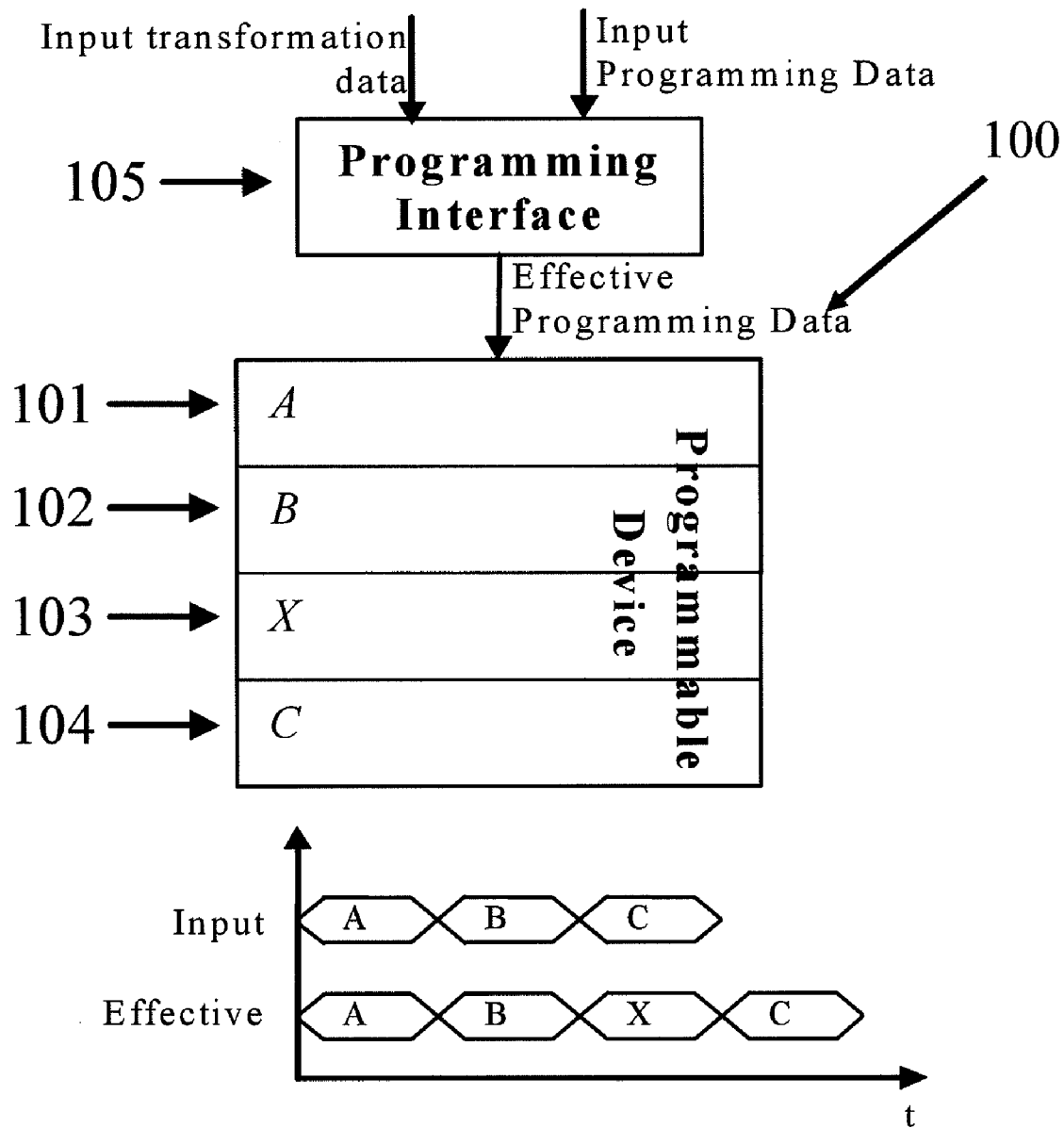
FIG. 3 is a high-level diagram of the system in accordance with one example of the present invention.

Now, with reference to FIG. 3, a detailed description of one example of the present invention will now be described. Again, as was the case in FIG. 1, the user programmable logic device 100 comprises four strips (or regions) 101, 102, 103 and 104.

In this example, three programming blocks A, B and C are to be programmed into the programmable logic device 100. First the programming data for the programmable device is created using Computer Aided Design (CAD) software. The CAD software behaves as if it was programming a device containing only three regions and so generates data for only three regions. This programming data is then stored in order to subsequently be sent to the programming interface circuit 105.

At the time of manufacturing, the results of tests carried out on the device are encoded and stored in memory so that they can also be sent to the programming interface circuit 105 at the time of programming. This information is contained in the input transformation data referred to in FIG. 3. In this example, region 103 is found to be faulty. Accordingly, the programming block C for that region will need to be moved to region 104. Moreover, the strip containing the faulty element must be programmed with a bypass configuration.

To do this, the programming interface circuit 105, in accordance with one example of the present invention, receives both programming data and transformation data. The programming interface circuit 105 then automatically alters the programming data in response to information about the location of the fault in the programmable device. The information relating to the location of the fault is contained in the transformation data. Depending on the exact architecture of the strip, the actual bypass configuration may be relatively simple to generate. If this is the case, the programming interface circuit 105 will be relatively small. For example, if the required configuration merely requires the generation of a plurality of zeros, then the programming interface circuit 105 could merely comprise a counter and a multiplexer which would insert zeroes into the programming data for the correct number of configuration cycles.

Figure 4:
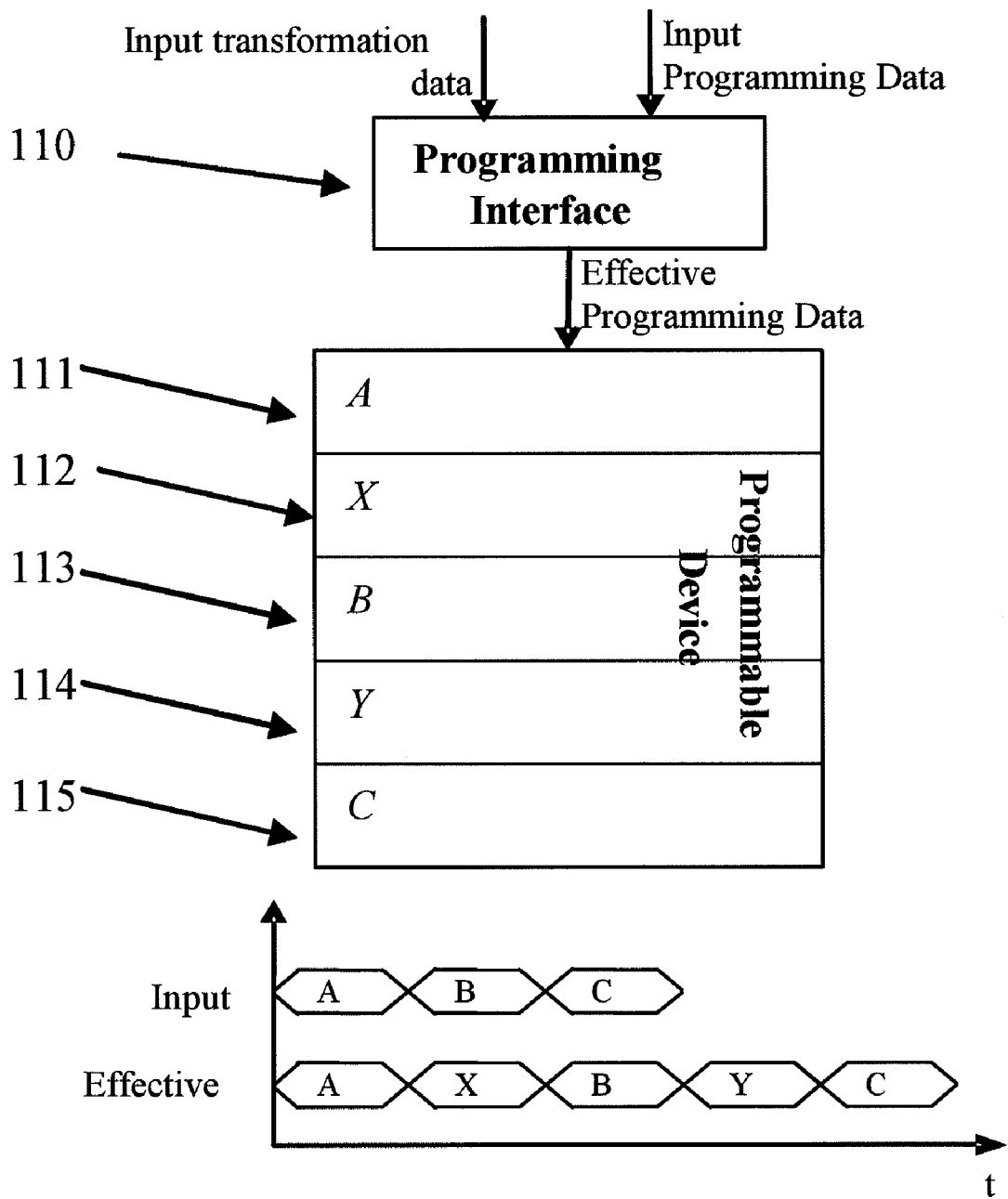
FIG. 4 is a high-level diagram of the system in accordance with one example of the present invention.

In the example of FIG. 4, blocks A, B and C are to be programmed into a programmable logic device. However, in this example, there are two faulty regions 112, 114. As in the previous example, the programming data for the programmable device is created using Computer Aided Design (CAD) software. The CAD software behaves as if it was programming a device containing only three regions and so generates data for only three regions. This programming data is then stored in order to subsequently be sent to the programming interface circuit 110.

As with the previous example, at time of manufacturing, the results of tests carried out on the device are encoded and stored in memory so that they can also be sent to the programming interface circuit 110 at the time of programming. In this example, regions 112 and 114 are found to be faulty. Accordingly, programming block B for which was originally meant for region 112 will need to be moved to region 113 and programming block C which was originally meant for region 113 will need to be moved to region 115. Moreover, the each strip containing faulty elements must be programmed with a bypass configuration.

In order to do this, the programming interface circuit 110, in accordance with one example of the present invention, receives both programming data and transformation data. The programming interface circuit 110 then automatically alters the programming data in response to information about the location of the faults in the programmable device. As with the previous example, the information relating to the locations of the faults is contained in the transformation data. The generation of the default configuration data can be performed as in the example of FIG. 3.

In the case where no faults are found, the programming interface circuit 10-5, 110 of the present invention will assign the last regions as faulty in the transformation data. Accordingly, the first blocks in the device will be programmed with the programming data and the last blocks will be logically invisible.

Figure 5:
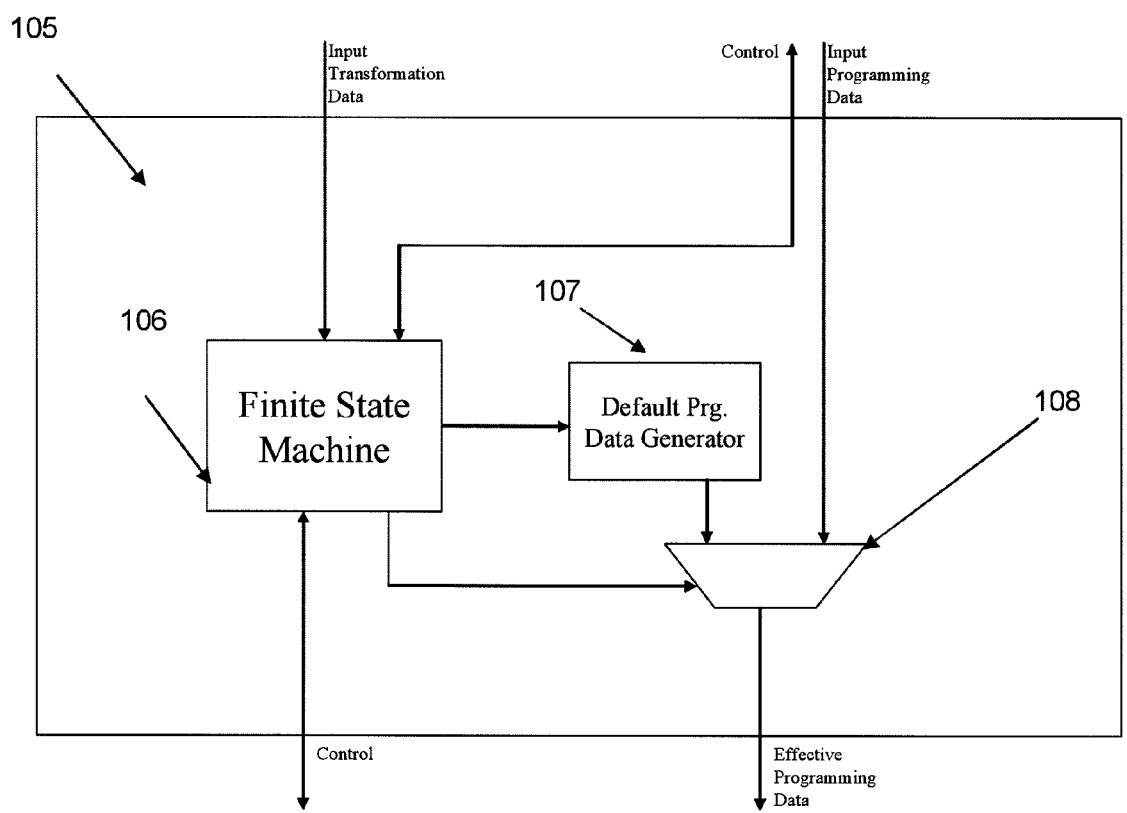
FIG. 5 is a more detailed diagram representing the programming interface of the systems of FIGS. 3 and 4.

Now, with reference to FIG. 5, a detailed description of the programming interface circuit 105 in accordance with another example of the invention will now be described. As with the earlier example, at the time of programming, the circuit 105 receives the programming data and the transformation data. As a result of the transformation data identifying region 103 as being faulty, the circuit 105 must send default programming data to the programmable logic device at the appropriate time in order to create the effective programming data.

In this example, the programming interface 105 comprises a Finite State Machine (FSM) 106 which monitors control signals coming from the external interface and the programmable device 100. The FSM 106 determines the appropriate time for inserting default programming data and controls the data insertion operation. The FSM 106 also generates output control signals to the external and programmable device interfaces.

One method which could be used by the FSM 106 to determine when to insert the default programming data would be count the number of configuration data elements which have been sent to the array. If it takes Y data elements to configure each strip and the Nth strip is defective, the default programming data should be inserted after Y×N data elements have been transferred. As will be appreciated by the skilled reader, other methods of determining when to insert default configuration data are also possible. For example, there may be special code words or tags in the programming data which identify when the programming of a strip is complete. In this case, the FSM 106 could be programmed to recognise and count the code words to determine when to insert the default programming data.

In the above embodiments, once the FSM 106 determines that it is the appropriate time to insert the default programming data, it switches the output of multiplexer 108 between the input programming data and the internally generated default programming data generated by the default programming data generator 107. Once the default programming data is sent, the output of multiplexer 108 is switched back to the input programming data and the subsequent regions are programmed. As can be seen from FIG. 3, the result of the above operations is that, although the programming data which was input into the programming interface contains information to program regions 101, 102 and 103, the effective programming data contains enough information to program four regions 101, 102, 103 and 104.

Depending on the architecture of the system in which the programmable device is embedded, the operation and implementation of the programming interface may be varied. For example, if the programming data is sent from a local cache memory, then the programming interface will pause reading the memory (i.e. using the control signal shown in FIG. 3) while it generates the data. Alternatively, if the programming data is being sent by some other entity in the system and cannot be stopped, then the programming interface circuit 105 may comprise a First-In-First-Out buffer (not shown) within which it will store the incoming programming data while inserting generated data into the effective programming data.

The invention claimed is:

1. A method of programming a programmable logic device, the programmable logic device comprising a plurality of serially connected programmable logic regions, the method comprising:
   receiving initial programming data for programming the plurality of serially connected programmable logic regions;
   receiving transformation data related to the presence and location of at least one faulty serially connected programmable logic region;
   generating bypass programming data which, in use, renders a serially connected programmable logic region logically invisible;
   generating effective programming data by incorporating, using information found in the transformation data, the bypass programming data into the initial programming data;
   programming the programmable logic device using the effective programming data such that the at least one faulty serially connected programmable logic region is programmed with the bypass programming data,
   wherein generating the effective programming data comprises:
   determining, using the transformation data, a specific point where the bypass programming data should be incorporated into the initial programming data, the specific point being related to the physical location of the faulty serially connected programmable logic region; and
   inserting the bypass programming data into the initial programming data at the specific point.

2. The method of claim 1, wherein inserting the bypass programming data into the initial programming data further comprises:
   halting the reception of the initial programming data until the bypass data has been inserted into the initial programming data; and
   resuming the reception of the initial programming data.

3. The method of claim 1, wherein inserting the bypass programming data into the initial programming data further comprises:
   storing incoming initial programming data into memory until the bypass data has been inserted into the initial programming data; and
   reading the initial programming data which was stored in the memory.

4. An apparatus for programming a programmable logic device, the programmable logic device comprising a plurality of serially connected programmable logic regions, the apparatus comprising:

an initial programming data receiver which receives initial programming data for programming the plurality of serially connected programmable logic regions;

a transformation data receiver which receives transformation data related to the presence and location of at least one faulty serially connected programmable logic region;

a bypass programming data generator which generates bypass programming data which, in use, renders a serially connected programmable logic region logically invisible;

an effective programming data generator which generates effective programming data by incorporating, using information found in the transformation data, the bypass programming data into the initial programming data;

a programmer which programs the programmable logic device using the effective programming data such that the at least one faulty serially connected programmable logic region is programmed with the bypass programming data, wherein the effective programming data generator comprises:

a determiner which determines, using the transformation data, a specific point where the bypass programming data should be incorporated into the initial programming data, the specific point being related to the physical location of the faulty serially connected programmable logic region; and an inserter which inserts the bypass programming data into the initial programming data at the specific point.

5. The apparatus of claim 4, wherein the inserter comprises:

a halter which halts the reception of the initial programming data until the bypass data has been inserted into the initial programming data; and a resumer which resumes resume the reception of the initial programming data.

6. The apparatus of claim 4, wherein the inserter comprises:

a storer which stores the incoming initial programming data into memory until the bypass data has been inserted into the initial programming data; and a reader which reads the initial programming data which was stored in the memory.

\* \* \* \* \*